United States Patent
Yasutake et al.

[19]

[11] Patent Number: 6,046,459
[45] Date of Patent: Apr. 4, 2000

[54] METHOD AND SYSTEM FOR CHARGED PARTICLE BEAM EXPOSURE

[75] Inventors: Nobuyuki Yasutake; Yoshihisa Ooae; Kazushi Ishida; Hiroshi Yasuda, all of Kawasaki; Akiyoshi Tsuda; Hitoshi Tanaka, both of Tokyo, all of Japan

[73] Assignees: Fujitsu Limited, Kawasaki; Advantest Corporation, Tokyo, both of Japan

[21] Appl. No.: 09/401,943

[22] Filed: Sep. 23, 1999

Related U.S. Application Data

[62] Division of application No. 09/042,747, Mar. 17, 1998, Pat. No. 5,981,118.

[30] Foreign Application Priority Data

Apr. 11, 1997 [JP] Japan .................................... 9-94200
Apr. 11, 1997 [JP] Japan .................................... 9-94204

[51] Int. Cl.⁷ .................................................. H01J 37/20
[52] U.S. Cl. ........................................ 250/492.2; 250/491.1
[58] Field of Search ............................ 250/492.2, 491.1

[56] References Cited

U.S. PATENT DOCUMENTS

| | | | |
|---|---|---|---|
| 4,636,968 | 1/1987 | Gotou et al. | 250/491.1 |
| 4,694,178 | 9/1987 | Harte | 250/492.2 |
| 5,981,118 | 11/1999 | Yasutake et al. | 430/30 |

Primary Examiner—Jack Berman
Attorney, Agent, or Firm—Staas & Halsey

[57] ABSTRACT

With using one scanning stage 19 where a plurality of wafers 16A to 16E is mounted through wafer holders 20A to 20E and balancing stage 21 disposed below scanning stage 19, scanning stage 19 is scanned based on exposure data common to a plurality of charged particle beam exposure apparatus 10A to 10E, and balancing stage 21 is scanned so that barycenter G of scanning stage 19 and balancing stage 21 becomes a fixed point. The positions of reflecting mirrors 70L and 70R secured to stage 19 are measured and based on their values, the expansion/contraction ratio of stage 19 and the positions of samples 16A to 16E are calculated to obtain deviation of the positions from target positions. Stage 19 is modeled such that rigid areas 19A to 19E are loosely connected, and for each area, the positions of three points are measured to calculate deviation of the exposure target position due to rotation of each ridged area. These deviations are corrected by deflectors 18A to 18D.

17 Claims, 9 Drawing Sheets

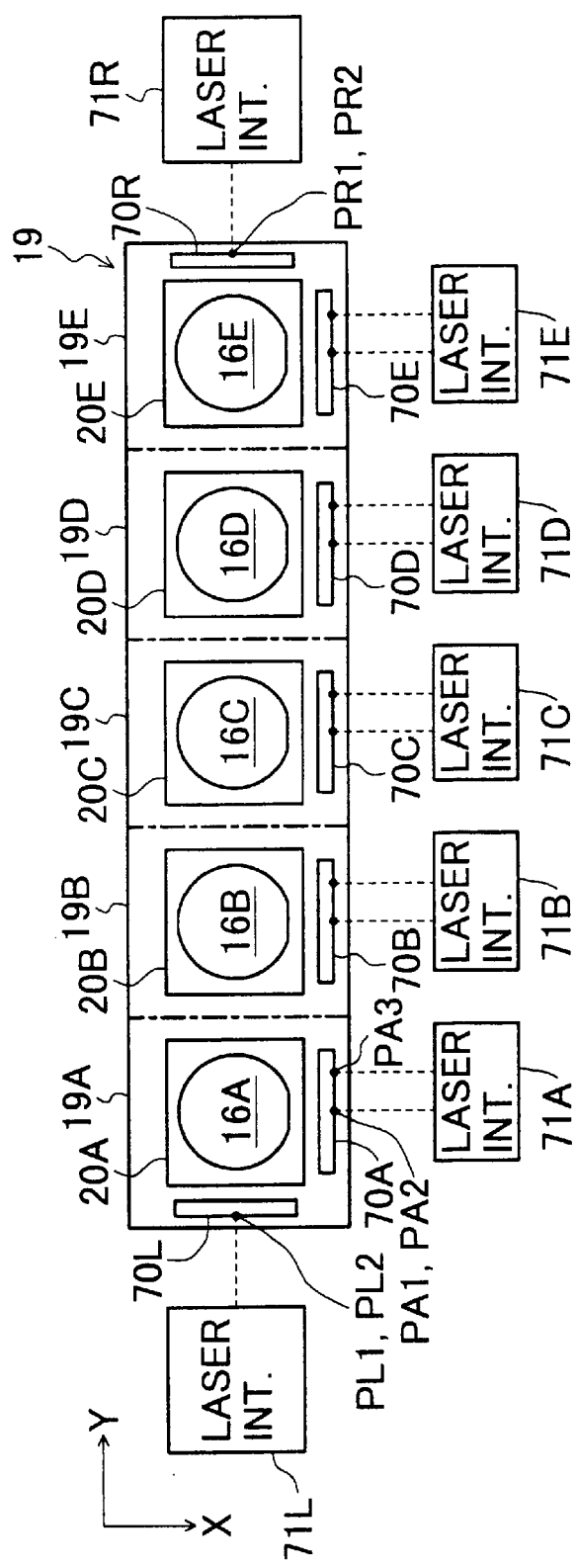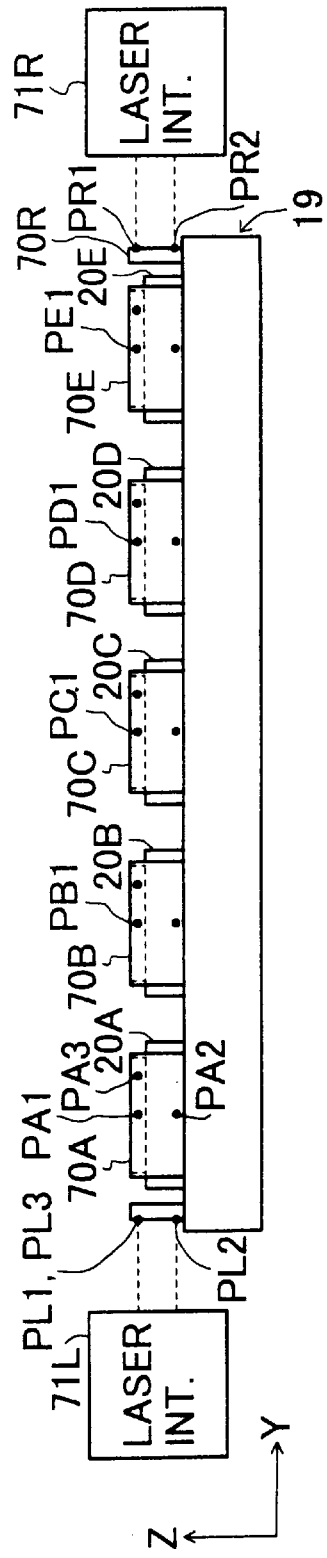

METHOD AND SYSTEM FOR CHARGED PARTICLE BEAM EXPOSURE

This application is a Divisional of application Ser. No. 09/042,747, filed Mar. 17, 1998, now U.S. Pat. No. 5,981,118, which claims priority to Japanese Patent Applications 9-94200 and 9-94204, filed Apr. 11, 1997 in Japan.

BACKGROUND OF THE INVENTION

1. Field of the Invention

The present invention relates to a method and a system for charged particle beam exposure in which a plurality of charged particle beam exposure apparatus placed in line are operated in parallel.

2. Description of the Related Art

In the prior art, an independent stage has been used for each charged particle beam exposure apparatus.

A charged particle beam exposure system has been proposed in which in order to reduce the placement space, a plurality of charged particle beam exposure apparatus is placed in line, a wafer is placed on the stage provided for each of the apparatus and the plurality of wafers is simultaneously exposed based on the same exposure data.

However, since the stages move in the same direction, slight vibration caused thereby is amplified. When the exposure pattern becomes extremely fine with the increase in degree of integration of semiconductor integrated circuits, slight vibration of the stages greatly affects the exposure position error.

To prevent the vibration, a method has been proposed in which, as shown in FIG. 8(A), two charged particle beam exposure apparatus 1A and 1B are placed in parallel to scan stages 19A and 19B so that barycenter G thereof do not shift. According to this method, as shown in FIG. 8(B), exposure is performed so that the exposure pattern on wafer 16A and the exposure pattern on wafer 16B are symmetrical with respect to point Q.

However, since two charged particle beam exposure apparatus 1A and 1B are merely placed in parallel, the total placement space cannot be smaller than the sum of the placement spaces of apparatus 1A and 1B.

An exposure system is considered in which a plurality of charged particle beam exposure apparatus is disposed in a line to form a multiple column, a sample chamber disposed below the multiple column is common to the plurality of charged particle beam exposure apparatus, one sample scanning stage is provided in the sample chamber and for a plurality of samples mounted on the stage, and exposure is simultaneously performed based on the same exposure data. According to this exposure system, since the exposure apparatus may be disposed closely to each other, it may be possible to reduce the placement space. In addition, since the same exposure data is used, the construction of the overall system may be simplified.

However, since the length of the stage increases in the direction of the line of the multiple column, it becomes more serious that the exposure position accuracy is decreased by variation in strain of the stage due to variation in temperature of the stage or variation in force exerted on the stage.

(1) Degradation of exposure position accuracy due to temperature variation of the stage For example, when five exposure apparatus are placed in a line with a pitch of 400 mm, the length of the stage is 2 m. When the stage is formed of alumina having a small density in order to operate the stage at high speed and to improve the stop accuracy, the linear expansion coefficient thereof is $4\times10^{-6}$/degrees. When the temperature of the stage changes by 0.01° C., the elongation of the stage becomes $4\times10^{-6}\times2\times10^{6}\times0.01=0.08$ μm.

For example, to form a pattern with a width of 0.5 μm, the expansion due to the temperature change of 0.01° C. cannot be ignored because an exposure position accuracy 1/10 of the width is required.

The temperature of the stage varies due to the irradiation of an electron beam onto the sample. It also varies due to friction at a guide for limiting the stage movement direction to guide the stage. The amount of the variation increases as the number of exposure apparatus placed in line increases. Further, the temperature of the stage changes due to variation in ambient temperature. It is difficult to restrain the temperature variation of the stage due to these causes to be 0.01° C. or lower, so that the exposure position accuracy decreases. This problem becomes more serious as the exposure pattern becomes finer.

In the prior art, since the stage for a single charged particle beam exposure apparatus has been short, it has not been a big problem that the exposure position accuracy decreases due to the temperature variation of the stage.

(2) Degradation of exposure position accuracy due to variation in force exerted on the stage The rigidity of the stage decreases as the length of the stage increases. In the charged particle beam exposure apparatus which generally employs the stage-in-lens type, the thickness of the stage for ensuring the rigidity of the stage is limited. On the other hand, as the length of the stage increases, the strain due to the tare weight increases, the linearity of machining decreases. Moreover, since the inertial force at the time of acceleration increases, the force received from the guide mechanism when the stage is driven increases to increase variation in strain due to variation in force exerted on the stage. Thus, as the length of the stage increases, variation in strain due to variation in force exerted on the stage increases.

When the stage is slightly rotated, Abbe errors are caused. For example, as shown in FIG. 9, assume that wafer 16 and reflecting mirror 70 are secured to a rigid stage (not illustrated). Laser beam LB is irradiated from a not-illustrated laser interferometric coordinate measuring equipment to point Q on the reflecting mirror 70 to measure the position of reflecting mirror 70. Charged particle beam EB is irradiated to point R0 which is an irradiating target position on wafer 16. A line passing through point R0 and perpendicular to wafer 16 and a line passing through point Q and perpendicular to reflecting mirror 70 intersect at point S0 at right angles. When the stage is slightly rotated about point Q by θ as shown in the figure, the points after the rotation corresponding to points R0 and S0 before the rotation are designated as R1 and S2, respectively, and the intersection point of the straight line of charged particle beam EB and wafer 16 after the rotation is designated as T.

Since point Q is the same before and after the rotation, the point of irradiation of charged particle beam EB onto wafer 16 changes from point R0 to point T due to the rotation even if the measurement values of the laser interferometric coordinate measuring equipment are the same. Since point R1 is the target position after the rotation, deviation Δ1 of point T from point R0 is the exposure position error (Abbe error+ Δ0), where Δ0 is the distance between point S1 and straight line R0_S0 and is the exposure position error (Abbe error is 0) when h=0.

For example, when L=200 mm and h=10 mm, assuming that the deviation of point Si with respect to point S0 is 5 μm, $\theta = 5/(200 \times 10^3)$ $\Delta 0 = 5 \ \theta = 0.125 \times 10^{-3} \ \mu m$.

$\Delta 1 - \Delta 0 = h\theta = 0.25 \ \mu m$.

Although $\Delta 0$ may be ignored, error $\Delta 1$ cannot be ignored. Consequently, the exposure position accuracy decreases due to the variation in force exerted on the stage. This problem becomes more serious as the exposure pattern becomes finer.

In the prior art, with assuming that a stage is overall rigid, rotational angle $\theta$ of the slight rotation of the stage is measured to correct the Abbe error. However, since a long stage cannot be regarded as being overall rigid, the correction accuracy is insufficient. As the exposure speed increases and the exposure pattern becomes finer, to make the correction, for example, at 10 MHz, it is necessary that the correction calculation cain be performed in a short period of time and that a sufficient correction accuracy be ensured.

SUMMARY OF THE INVENTION

Accordingly, an object of the present invention is to provide a method and a system for charged particle beam exposure in which the vibration of a scanning stage is reduced when the scanning stage is common to a plurality of charged particle beam exposure apparatus.

Another object of the present invention is to provide a method and a system for charged particle beam exposure in which the exposure position accuracy is improved when a sample scanning stage as described above is used.

In the 1st aspect of the present invention, there is provided a charged particle beam exposure method using a plurality of charged particle beam exposure apparatus placed in line to parallelly expose a plurality of samples with scanning a plurality of charged particle beams and the plurality of samples, the method comprising the steps of: providing a single scanning stage where the plurality of samples is mounted and providing a balancing stage; scanning the scanning stage based on exposure data; and scanning the balancing stage in such a way that a barycenter of the scanning stage and the balancing stage becomes a fixed point.

According to the 1st aspect of the present invention, since one common scanning stage is used for a plurality of charged particle beam exposure apparatus placed in line, the wafer-to-wafer distance is shorter than when a plurality of independent scanning stages is used. As a result, the placement space per charged particle beam exposure apparatus can be smaller than that in FIG. 8(A).

Moreover, in scanning of the scanning stage, since the balancing stage is scanned so that the barycenter of the scanning stage and the balancing stage becomes a fixed point, the vibration of the scanning stage is reduced which would be caused when no balancing stage were used. Thus, the present invention contributes to higher accuracy of exposure patterns, finer circuit devices and larger scale of semiconductor integrated circuits.

Further, since a plurality of samples may be mounted on the scanning stage in the same direction, the structure of a wafer mounting apparatus can be simpler than when the samples are mounted in different directions.

In the 2nd aspect of the present invention, there is provided a charged particle beam exposure method as defined in the 1st aspect, wherein the balancing stage is scanned below the scanning stage.

According to the 2nd aspect of the present invention, the placement space can be further reduced.

In the 3rd aspect of the invention, there is provided a charged particle beam exposure method as defined in the 2nd aspect, wherein the exposure data is common to the plurality of charged particle beam exposure apparatus.

In the 4th aspect of the present invention, there is provided a charged particle beam exposure method as defined in the 3rd aspect, comprising the additional steps of: providing a cassette for storing the plurality of samples; taking out the plurality of samples from the cassette; and mounting the plurality of samples taken out on the scanning stage at positions corresponding to the plurality of charged particle beam exposure apparatus, respectively, before the scanning step of the scanning stage.

According to the 4th aspect of the present invention, since it is necessary to use only one cassette for a plurality of charged particle beam exposure apparatus, the construction of the charged particle beam exposure system can be simplified.

In the 5th aspect of the present invention, there is provided a charged particle beam exposure system including a plurality of charged particle beam exposure apparatus placed in line to parallelly expose a plurality of samples with scanning a plurality of charged particle beams and the plurality of samples, the charged particle beam exposure system comprising: a single scanning stage where the plurality of samples is mounted: a balancing stage; and a stage controller for controlling scanning of the balancing stage in such a way that a barycenter of the scanning stage and the balancing stage becomes a fixed point.

In the 6th aspect of the present invention, there is provided a charged particle beam exposure system as defined in the 5th aspect, wherein the balancing stage is disposed below the scanning stage.

In the 7th aspect of the present invention, there is provided a charged particle beam exposure method using a plurality of charged particle beam exposure apparatus placed. in line to parallelly expose a plurality of samples with scanning a plurality of charged particle beams by deflectors and with scanning the plurality of samples, the method comprising the steps of: providing a single scanning stage where the plurality of samples is mounted; measuring a position of each lengthwise end portion of the scanning stage as measured end positions; calculating positions of the plurality of samples mounted on the scanning stage based on the measured end positions; calculating deviation of the calculated positions of the plurality of samples from target positions thereof as sample position errors; and correcting the sample position errors by the deflectors.

The temperature of the scanning stage varies due to the irradiation of a charged particle beam onto the sample. It also varies due to friction at a guide for limiting the scanning stage movement direction to guide the scanning stage. The amount of the variation increases as the number of exposure apparatus placed in line increases. The response of the temperature detector is as slow as several minutes. However, according to the 7th aspect aspect of the present invention, since the variation in position of a plurality of samples due to the temperature variation is directly corrected in real time, the exposure position accuracy improves and high-speed scanning of the scanning stage which causes more temperature variation is enabled. Thus, the present invention contributes to improved throughput of charged particle beam exposure.

In the 8th aspect of the present invention, there is provided a charged particle beam exposure method as defined in the 7th aspect, wherein the calculating position step includes calculating an expansion/contraction ratio of the scanning stage based on the measured end positions and a reference length of the scanning stage to obtain the positions of the plurality of samples mounted on the scanning stage.

According to the 8th aspect of the present invention, deviation of each exposure target position due to temperature variation is corrected, so that the exposure position accuracy further improves.

In the 9th aspect of the present invention, there is provided a charged particle beam exposure method as defined in the 7th aspect, comprising the additional steps of: modeling the scanning stage as that a plurality of rigid areas is coupled loosely, each of the rigid areas having one of the samples mounted; measuring at least two positions on a side portion for each of the rigid areas as measured side positions to obtain rotational angle; calculating deviation of an exposure target position due to a rotation of each of the rigid areas as a rotational exposure position error based on the measured side positions; and correcting each the rotational exposure position error by each of the deflectors.

Since the rigidity of the scanning stage decreases as the length of the scanning stage increases, the strain correction accuracy decreases if the scanning stage is treated as being overall rigid. Moreover, as the length of the scanning stage increases, the strain due ,to the tare weight increases, the linearity of machining decreases and the inertial force at the time of acceleration increases, so that the force received from the guide mechanism when the scanning stage is driven increases to increase variation in strain due to variation in internal and external force exerted on the scanning stage. However, according to the 9th aspect aspect of the present invention, since a non-rigid operation of the scanning stage is considered, the strain correction accuracy considerably improves. Moreover, since the scanning stage is modeled as described above, the strain is easily calculated, so that even when the scanning stage is scanned at high speed, the strain may be corrected in real time. Thus, the present invention contributes to improved throughput of charged particle beam exposure.

In the 10th aspect of the present invention, there is provided a charged particle beam exposure method as defined in the 9th aspect, wherein the rotation includes a first rotation about a first axis in a lengthwise direction of the scanning stage, and wherein the rotational exposure position error includes a Y-pitching Abbe error proportional to a rotational angle $\theta_Y$ of the first rotation.

In the 11th aspect of the present invention, there is provided a charged particle beam exposure method as defined in the 9th aspect, wherein the rotation includes a second rotation about a second axis perpendicular to a sample plane; wherein the rotational exposure position error includes a difference between a vector of the exposure target position whose starting point is a substantial intersection point of an optical axis and the sample plane and a vector which is derived from rotating the vector of the exposure target position by a rotational angle $\theta_Z$ of the second rotation.

In the 12th aspect of the present invention, there is provided a charged particle beam exposure method as defined in the 9th aspect, wherein the rotation includes a second rotation about a second axis perpendicular to a sample plane; wherein the rotational exposure position error includes a yawing Abbe error proportional to a rotational angle $\theta_Z$ of the second rotation.

In the 13th aspect of the present invention, there is provided a charged particle beam exposure method as defined in the 9th aspect, wherein the rotation includes a third rotation about a third axis perpendicular to both of the first axis and the second axis; and wherein the rotational exposure position error includes a X-pitching Abbe error proportional to a rotational angle $\theta_X$ of the third rotation.

In the 14th aspect of the present invention, there is provided a charged particle beam exposure method as defined in the 7th aspect, modeling the scanning stage as that a plurality of rigid areas is coupled loosely, each of the rigid areas having one of the samples mounted, a number of the rigid areas being 3 or more; measuring at least two positions of each lengthwise end portion of the scanning stage as measured end positions to obtain each rotational angle $\theta_X$ about an axis perpendicular to both a lengthwise direction of the scanning stage and a normal direction to a sample plane, the each rotational angle $\theta_X$ being of end parts of the rigid areas; calculating deviations of exposure target positions due to each the rotational angle $\theta_X$ as a first X-pitching Abbe error proportional to the rotational angle $\theta_X$ based on the measured end positions; obtaining second X-pitching Abbe error(s) of the rigid areas excepting the end parts of the rigid areas as values of function(s) of the first X-pitching Abbe errors for end parts of the rigid areas; and correcting the first and second X-pitching Abbe errors by the deflectors.

According to the 14th aspect of the present invention, since Abbe errors of intermediate rigid areas in which the measurement of angle $\theta_X$ is difficult are corrected, the exposure position accuracy when a comparatively long scanning stage is used is further improved.

In the 15th aspect of the present invention, there is provided a charged particle beam exposure method as defined in the 14th aspect, wherein the obtaining step includes: expressing the function(s) each having a parameter; measuring a set of the first Abbe errors for the end parts of the rigid areas and an actual exposure position on any of the rigid areas excepting the end parts of the rigid areas a plurality of times; deriving actual exposure position errors from the actual exposure positions and an exposure target position thereof; and deciding the parameter in such a way that deviation of Abbe errors, each of which is obtained by substituting the first Abbe errors for the end parts of the rigid areas into the function, from the actual exposure position errors become minimum as a whole.

In the 16th aspect of the present invention, there is provided a charged particle beam exposure method as defined in the 9th aspect, wherein the rotation includes a first rotation about a first axis in a lengthwise direction of the scanning stage, a second rotation about a second axis perpendicular to a sample plane and a third rotation about a third axis perpendicular to both of the first axis and the second axis, and wherein the rotational exposure position error includes a Y-pitching Abbe error proportional to a rotational angle $\theta_Y$ of the first rotation, a yawing Abbe error proportional to a rotational angle $\theta_Z$ of the second rotation, and a X-pitching Abbe error proportional to a rotational angle $\theta_X$ of the third rotation.

In the 17th aspect of the present invention, there is provided a charged particle beam exposure system including a plurality of charged particle beam exposure apparatus placed in line to parallelly expose a plurality of samples with scanning a plurality of charged particle beams by deflectors and the with scanning samples, the system comprising: a single scanning stage where the plurality of samples is mounted; first and second reflecting means secured respectively to first and second lengthwise end portions of the scanning stage in such a way that back surfaces thereof are opposed to each other; first and second laser interferometric coordinate measuring equipment disposed on fixed sides apart from the scanning stage so that laser beams therefrom are perpendicularly irradiated to mirror surfaces of the first and second reflecting means, respectively to obtain measured end positions; and a correcting circuit for calculating positions of the plurality of samples mounted on the scanning stage based on the measured end positions, calculating deviation of the calculated positions of the plurality of samples from target positions thereof as sample position errors and outputting a correction value to correct the sample position errors as a component by the deflectors.

In the 18th aspect of the present invention, there is provided a charged particle beam exposure system as defined in the 17th aspect, wherein the correcting circuit calculates an expansion/contraction ratio of the scanning stage based on the measured end positions and a reference length of the scanning stage to obtain the positions of the plurality of samples mounted on the scanning stage.

In the 19th aspect of the present invention, there is provided a charged particle beam exposure system as defined in the 18th aspect, further comprising: third reflecting means secured to the scanning stage corresponding to respective the samples mounted on the scanning stage in such a way that reflecting surfaces thereof are perpendicular to those of the first and second reflecting means; and third laser interferometric coordinate measuring equipment disposed on fixed sides apart from the scanning stage so that laser beams therefrom are perpendicularly irradiated to respective the mirror surfaces of the third reflecting means to measure at least two positions on the third reflecting means as measured side positions for each of the samples mounted on the scanning stage; and wherein the correcting circuit calculates rotational angles of respective the third reflecting means based on the measured side positions, calculates deviation of an exposure target position due to a rotation of each of rigid areas as a rotational exposure position error based on the measured side positions, and outputs the correction value to correct the rotational exposure position error as a component by the deflectors, where the rigid areas are of a model of the scanning stage, the model is such that a plurality of the rigid areas is coupled loosely, each of the rigid areas having one of the samples mounted.

In the 20th aspect of the present invention, there is provided a charged particle beam exposure system as defined in the 19th aspect, wherein at the correcting circuit, the rotation includes a first rotation about a first axis in a lengthwise direction of the scanning stage, a second rotation about a second axis perpendicular to a sample plane and a third rotation about a third axis perpendicular to both of the first axis and the second axis, and the rotational exposure position error includes a Y-pitching Abbe error proportional to a rotational angle $\theta_Y$ of the first rotation, a yawing Abbe error proportional to a rotational angle $\theta_Z$ of the second rotation, and a X-pitching Abbe error proportional to a rotational angle $\theta_X$ of the third rotation.

In the 21st aspect of the present invention, there is provided a charged particle beam exposure system as defined in the 20th aspect, wherein a number of the rigid areas being 3 or more, wherein the first and second laser interferometric coordinate measuring equipment measure at least two positions on each of the mirror surfaces of the first and second reflecting means to obtain the rotational angle $\theta_X$ of the third rotation with regard to each of the end parts of the rigid areas, and wherein the correcting circuit calculates a first X-pitching Abbe error proportional to the rotational angle $\theta_X$ with regard to each of the end parts of the rigid areas, obtains second X-pitching Abbe error(s) of the rigid areas excepting the end parts of the rigid areas as value(s) of function(s) of the first X-pitching Abbe error for each of the end parts of the rigid areas and corrects the firsthand second X-pitching Abbe errors by the deflectors.

BRIEF DESCRIPTION OF THE DRAWINGS

FIGS. 4(A) and 4(B) are a plan view and a front view, respectively, schematically showing the structure of a stage position measuring portion;

DESCRIPTION OF THE PREFERRED EMBODIMENT

Figure 1:
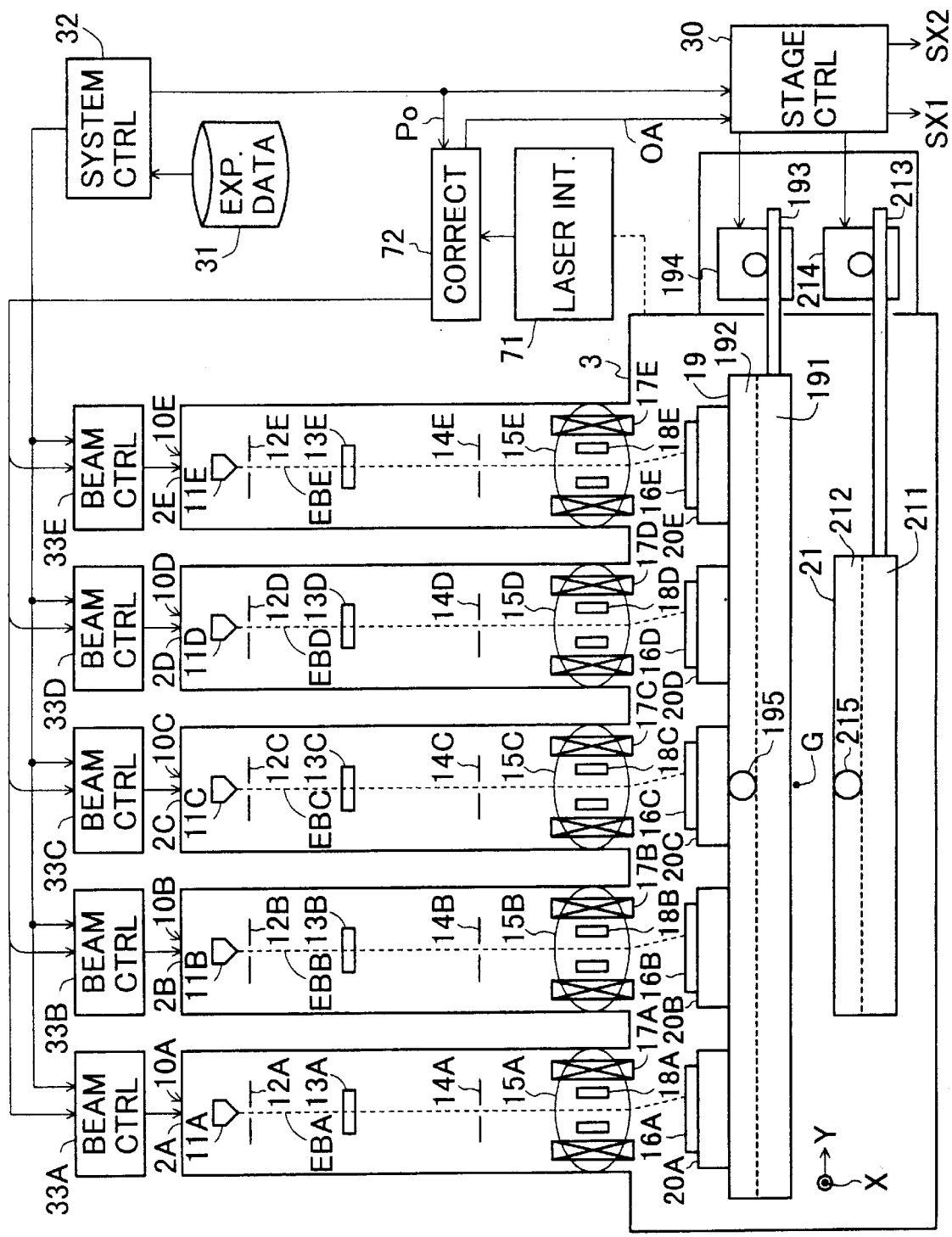
FIG. 1 is a schematic structural view of a charged particle beam exposure system according to an embodiment of the present invention.

Referring now to the drawings, wherein like reference characters designate like or corresponding parts throughout several views, a preferred embodiment of the present invention are described below.

Figure 2:
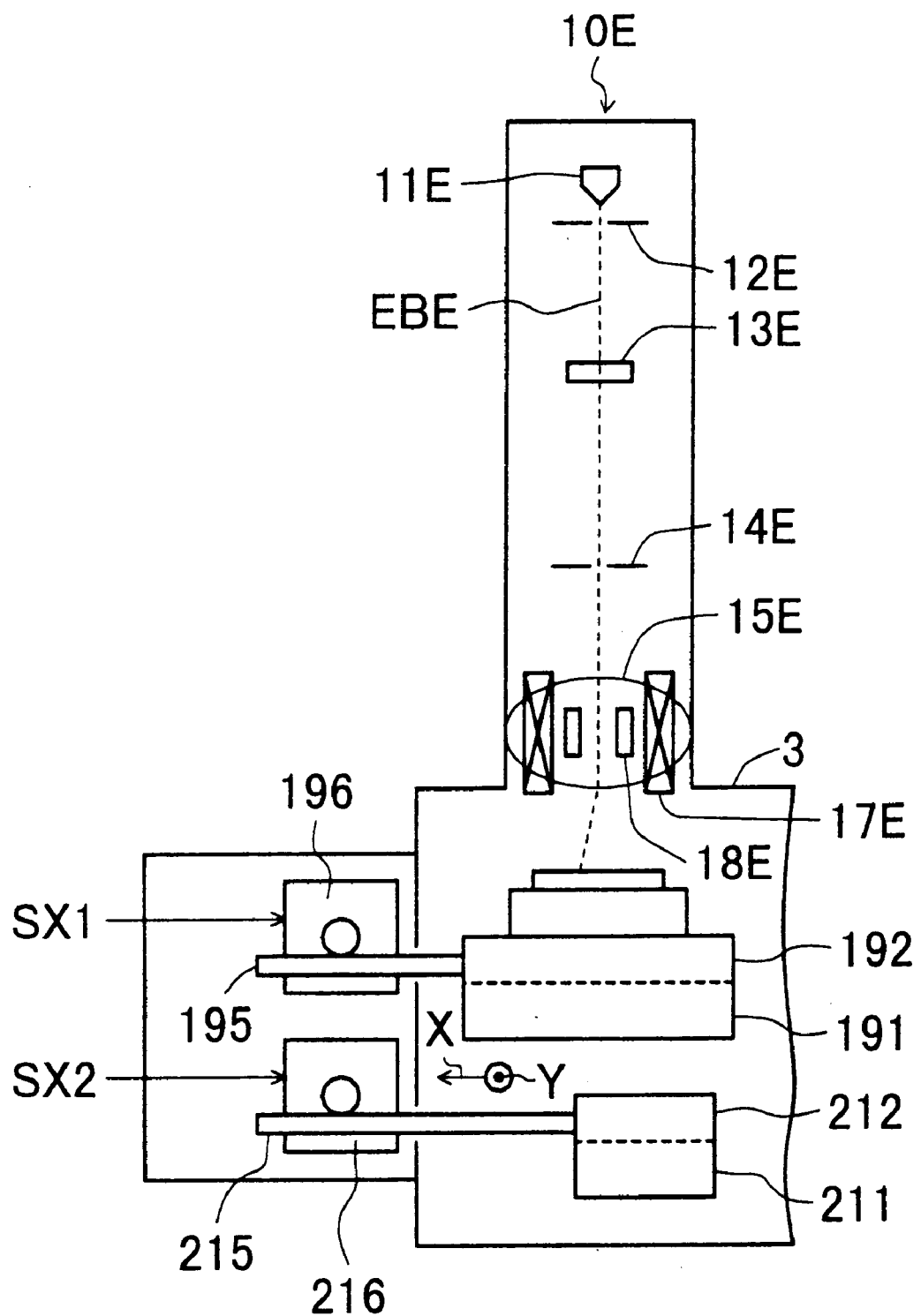
FIG. 2 is a schematic right side view of a part of the system of FIG. 1.
Figure 3:
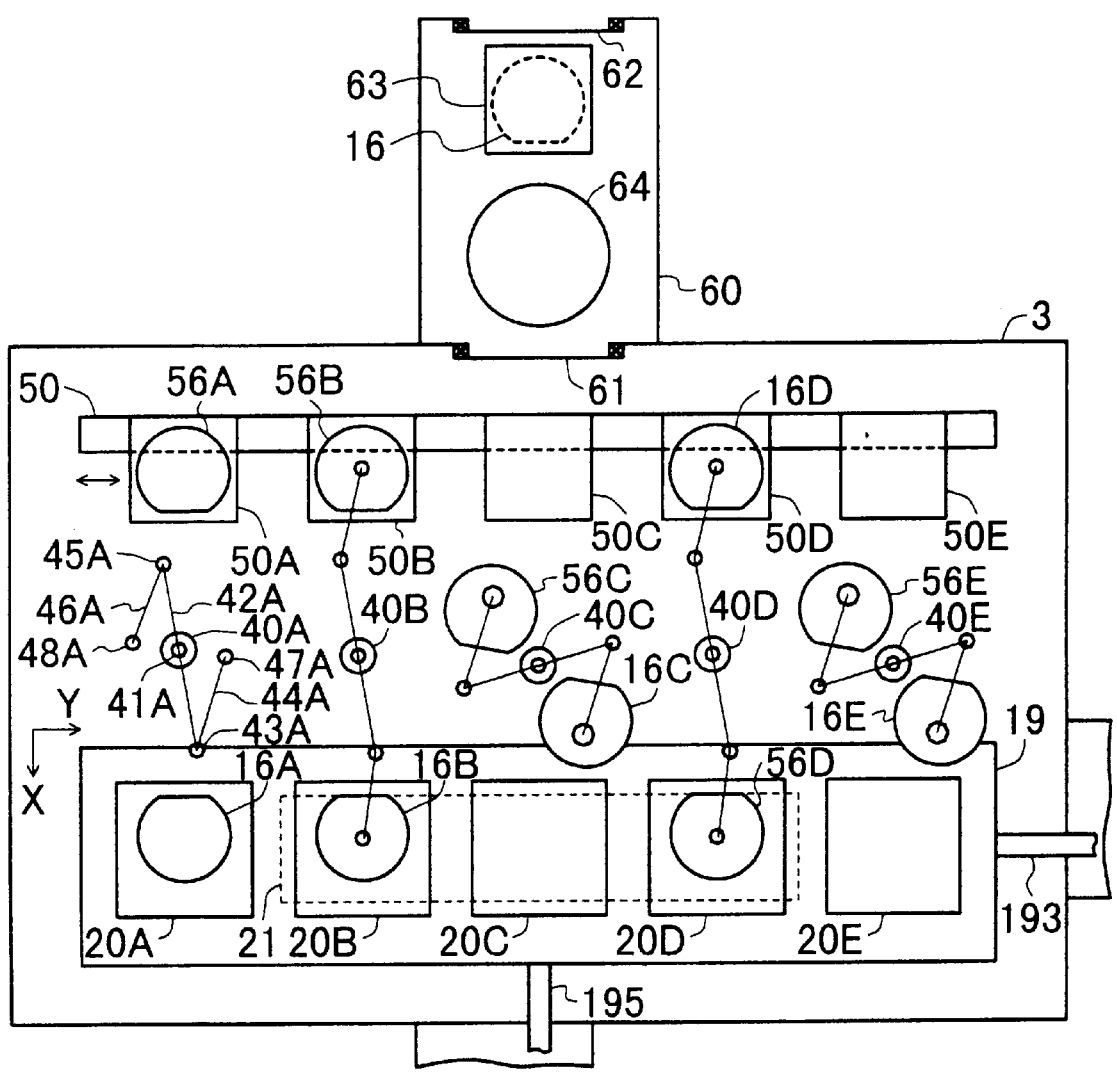
FIG. 3 is a schematic plan view of the system of FIG. 1.

FIG. 1 is a schematic structural view of a charged particle beam exposure system. FIG. 2 is a schematic right side view of a part of the system. FIG. 3 is a schematic plan view of the interior of a sample chamber of the system.

As shown in FIG. 1, in this system, charged particle beam exposure apparatus 10A to 10E having the same structure are placed in line. A vacuum chamber has a configuration such that equally spaced columns 2A to 2E disposed in parallel in a line are set up on sample chamber 3. In FIGS. 1 to 3, corresponding components in columns 2A to 2E are denoted by the same reference numerals with adding letters A to E, respectively. The optical systems in columns 2A to 2E are shown only partially.

In column 2A, charged particle beam EBA, for example an electron beam, emitted from charged particle beam gun 11A passes through a rectangular aperture of aperture stop 12A to be shaped and further passes through mask 13A to be shaped. Mask 13A may be any of a mask having one rectangular aperture formed therein, a stencil mask having a plurality of block patterns of apertures formed therein and a blanking aperture array mask, etc. While the structure of the optical systems partly differs according to the type of the mask being used, only the portions of the optical systems which do not differ according to the type of mask 13A are shown in FIG. 1.

Charged particle beam EBA having passed through mask 13A has its beam solid angle limited at the circular aperture of aperture stop 14A and then, passes through objective lens 15A to be convergently irradiated onto wafer 16A serving as a sample in sample chamber 3, so that the pattern of mask 13A is projected onto wafer 16A with demagnification. To scan the position of irradiation on wafer 16A, charged particle beam EBA is deflected when passing through main deflector 17A and sub-deflector 18A. Columns 2B to 2E have the same internal structure as column 2A.

In sample chamber 3, sample scanning stage 19 is disposed which is common to charged particle beam exposure apparatus 10A to 10E. Stage 19 includes Y stage 191 movable in the shown Y direction corresponding to the line direction of columns 2A to 2E and X stage 192 movable in X direction (direction perpendicular to the plane of the figure) perpendicular to Y direction with respect to Y stage 191. Feed bar 193, which is fixed at a side portion thereof and protrudes therefrom, is driven in its axial direction by pulse motor 194, so that Y stage 191 is moved in Y direction with being guided by a not-illustrated guide. Feed bar 195, which is fixed at a side portion thereof and protrudes therefrom, is driven in its axial direction (direction perpendicular to the plane of the figure) by pulse motor 196 of FIG. 2, so that X stage 192 is moved in X direction with being guided by a not-illustrated guide.

As shown in FIG. 1, on stage 19, wafer holders 20A to 20E are disposed in correspondence with columns 2A to 2E, respectively. Wafer holders 20A to 20E are provided for securing wafers 16A to 16E, respectively, for fine-adjusting X and Y direction positions with respect to stage 19, and for fine-adjusting the in-plane azimuths of wafers 16A to 16E with respect to stage 19. Each of wafer holders 20A to 20E provides with a wafer securing member, for example a pressure plate, and actuators for fine-adjusting of the position and azimuth, for example piezo-electric elements. The fine-adjustment is performed in the following manner: Wafers 16A to 16E are imaged by not-illustrated CCD cameras disposed above wafer holders 20A to 20E, respectively, the positions of a plurality of marks formed on wafers 16A to 16E are detected and based on the deviation of the positions from the target positions, the fine-adjustment is performed.

Below stage 19, balancing stage 21 is disposed for preventing the barycenter of stages 19 and 21 from being shifted. Balancing stage 21 has the same structure as stage 19 and includes Y stage 211 movable in Y direction and X stage 212 movable in X direction with respect to Y stage 211. Feed bar 213, which is fixed at a side portion thereof and protrudes therefrom, is driven in its axial direction by pulse motor 214, so that Y stage 211 is moved in Y direction with being guided by a not-illustrated guide. Feed bar 215, which is fixed at a side portion thereof and protrudes therefrom in a direction perpendicular to the plane of the figure, is driven in its axial direction by pulse motor 216 of FIG. 2, so that X stage 212 is moved in X direction with being guided by a not-illustrated guide.

Pulse motors 194 and 214 of FIG. 1 and pulse motors 196 and 216 of FIG. 2 are driven by drive signals SY1, SY2, SX1 and SX2 provided from stage controller 30 of FIG. 1, respectively. Drive signals SY1 and SX1 are decided from target position (X1, Y1) of scanning stage 19 provided from system controller 32 based on exposure data stored in storage 31. Drive signals SY2 and SX2 are decided so that barycenter G (XG, YG) of scanning stage 19 and balancing stage 21 becomes a fixed point. More specifically, when the masses of scanning stage 19 and balancing stage 21 are M1 and M2, respectively, drive signals SY2 and SX2 are decided from target position (X2, Y2) of balancing stage 21:

$$X2=XG+(M2/M1)(XG-X1)$$

$$Y2=YG+(M2/M1)(YG-Y1)$$

For example, if M1=M2 and XG=YG=0, then X2=-X1 and Y2=-Y1 and both the target positions are point-symmetrical to each other with respect to barycenter G.

Charged particle beams EBA to EBE of charged particle beam exposure apparatus 10A to 10E are controlled by system controller 32 through beam controllers 33A to 33E. System controller 32 provides a common signal to beam controllers 33A to 33E based on exposure data stored in storage 31. Beam controllers 33A to 33E have the same structure and are provided with registers for holding parameters to correct variations in fixing positions and sensitivities of the optical elements of charged particle beam exposure apparatus 10A to 10E. In order that the same exposure patterns are obtained, beam controllers 33A to 33E correct the common signal from system controller 32 with the parameters held in those registers and control charged particle beams EBA to EBE through the optical systems.

In sample chamber 3, as shown in FIG. 3, apparatus are provided for automatically changing the wafers on wafer holders 20A to 20E. More specifically, arm robots 40A to 40E are disposed at sides of wafer holders 20A to 20E, respectively. Arm robot 40A has arm 42A rotatable about rotation axis 41A perpendicular to the plane of the figure, arm 44A attached to an end of arm 42A through joint 43A, arm 46A attached to the other end of arm 42A through joint 45A and absorptive portions 47A and 48A attached to the ends of arms 44A and 46A, respectively. Transporters 50A to 50E are disposed at sides of arm robots 40A to 40E so as to be movable along ring-shaped guide 51.

On a side surface of sample chamber 3, loading chamber 60 is provided. In loading chamber 60, airtight shutters 61 and 62 are provided on the side of sample chamber 3 and on the side opposite thereto, respectively. In loading chamber 60, wafer cassette 63 storing five or more wafers is disposed on the side of shutter 62, and loader 64 of which structure is not shown is disposed on the side of shutter 61.

Next, an operation of this embodiment thus structured will be described.

(1) Shutter 62 is opened with shutter 61 being closed, and wafer cassette 63 storing five or more wafers to be exposed is placed in loading chamber 60. Then, shutter 62 is closed. After loading chamber 60 is evacuated, shutter 61 is opened.

(2) On the one hand, transporters 50A to 50E are moved in one direction along guide 51 and on the other hand, the wafers in wafer cassette 63 are taken out by loader 64. Then, a wafer is placed on transporter 50A moved to a position near the loader 64. The wafer taking out and placing operation is repeated five times. Through this operation, the wafers are mounted one on each of transporters 50A to 50E when transporters 50A to 50E have made a round of guide 51.

(3) Under this state, the wafers on transporters 50A to 50E and the wafers on wafer holders 20A to 20E are replaced with each other by arm robots 40A to 40E, respectively. Although these replacements are parallelly performed by arm robots 40A to 40E, FIG. 3 shows different states thereof to hereinafter explain the operation of arm robot 40A with reference to the states of arm robots 40A to 40D.

In FIG. 3, as for arm robot 40A, a state before the replacement is shown. When arms 44A and 46A are rotated from this state, arm robot 40A is brought into a state like that of arm robot 40B shown in the figure, so that wafers 56A not having been processed and wafer 16A having been processed are absorbed by absorptive portions 48A and 47A, respectively. Then, arms 44A and 46A are further rotated with rotating arm 42A counterclockwise, and arm robot 40A is brought into a state like that of arm robot 40C shown in the figure. Then, arm 42A is further rotated from this state with rotating arms 44A and 46A in the opposite direction, arm robot 40A is brought into a state like that of arm robot 40D shown in the figure. Wafers 56A and 16A are separated from absorptive portions 48A and 47A and mounted on wafer holder 20A and transporter 50A, respectively.

Arm robots 40B to 40E operate in a similar manner to arm robot 40A.

(4) Then, on the one hand, operations opposite in time to the operation described in (2) are performed so that the processed wafers on transporters 50A to 50E are stored in wafer cassette 63. Then, shutter 61 is closed. On the other hand, the positions of the wafers on wafer holders 20A to 20E are fine-adjusted as described above and the wafers are secured onto wafer holders 20A to 20E.

(5) Then, system controller 32 performs simultaneous and parallel exposure processing on the wafers on wafer holders 20A to 20E through stage controller 30 and beam controllers 33A to 33E by use of exposure data stored in storage 31 which data are common to charged particle beam exposure apparatus 10A to 10E. Stage controller 30 drives balancing stage 21 so that barycenter G of scanning stage 19 and balancing stage 21 does not shift as described above.

According to this embodiment, by thus driving balancing stage 21, vibration of scanning stage 19 can be reduced which would be caused if balancing stage 21 were not used, so that the exposure pattern accuracy improves. As a result, a semiconductor integrated circuit can be obtained which has finer elements.

Figure 8A:
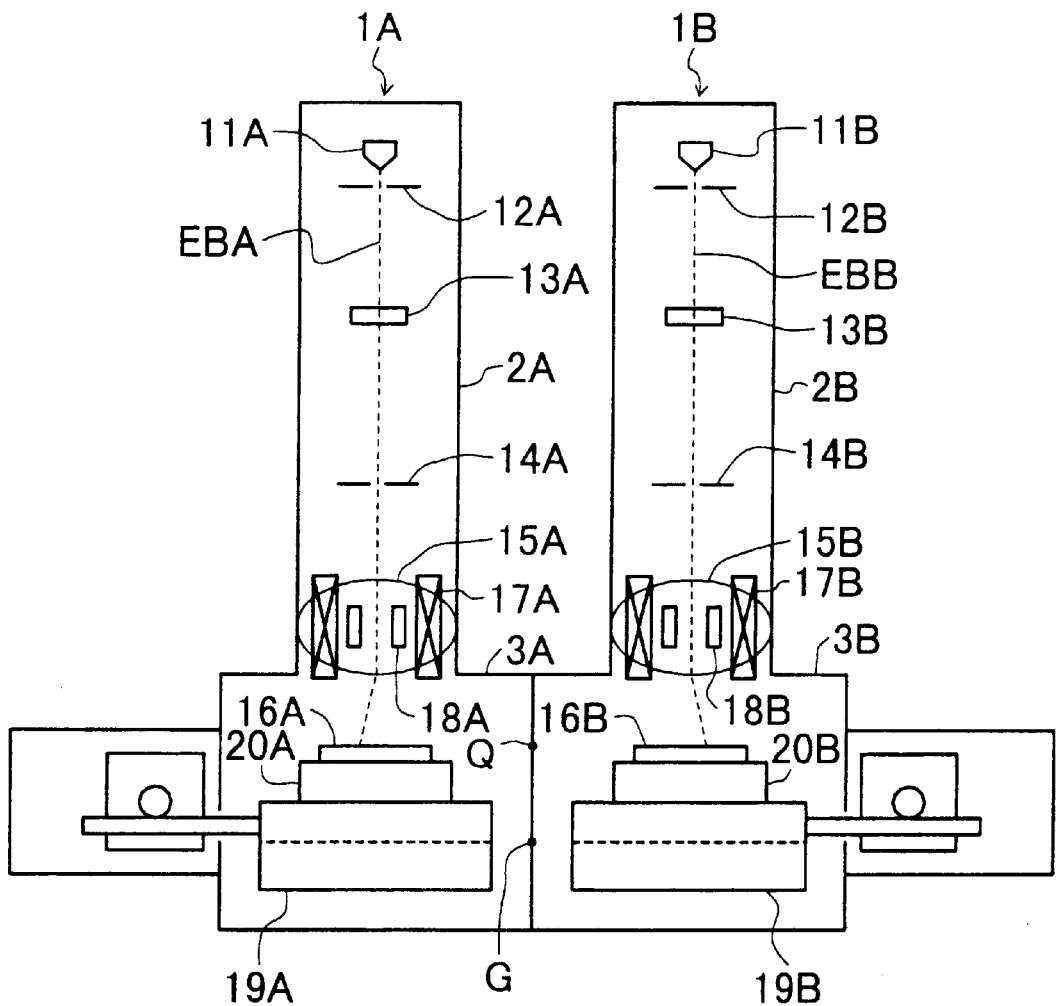
FIG. 8(A) is a schematic structural view showing a charged particle beam exposure system to be put in contrast with the present invention.

In addition, since scanning stage 19 is used which is common to charged particle beam exposure apparatus 10A to 10E placed in line, the wafer-to-wafer distance is shorter than that when, as shown in FIG. 8(A), charged particle beam exposure apparatus 1A and 1B independent of each other are placed in parallel without any space therebetween. As a result, the placement space per charged particle beam exposure apparatus can be smaller than that in FIG. 8(A). This effect is increased by disposing balancing stage 21 below scanning stage 19.

Figure 8B:
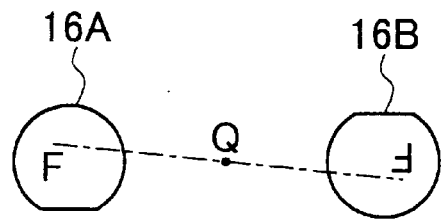
FIG. 8(B) shows point symmetry exposure of wafers.

Further, since wafers 16A to 16E may be mounted in the same direction on wafer holders 20A to 20E, the structure of the wafer mounting apparatus, for example, the structure of arm robots 40A to 40E or loader 64 of FIG. 3 can be simpler than when the wafers are mounted in different directions as shown in FIG. 8(B).

FIGS. 4(A) and 4(B) are a plan view and a front view, respectively, schematically showing the structure of a stage position measuring portion.

In order to measure the position of stage 19 with high accuracy, reflecting mirrors 70A to 70E, 70L and 70R (not illustrated in FIG. 1) are securely set up at a side portion on stage 19. Reflecting mirrors 70A to 70E are in parallel in Y direction and correspond to wafer holders 20A to 20E, respectively. Reflecting mirrors 70L and 70R are in parallel in X direction and situated at one end and at the other end of stage 19. Laser interferometric coordinate measuring equipment 71A to 71E, 71L and 71R (not illustrated in FIG. 1) are disposed on the fixed side apart from stage 19 in an arrangement that there are opposite to the reflecting surfaces of reflecting mirrors 70A to 70E, 70L and 70R, respectively.

Strain of stage 19 varies based on variation in temperature of stage 19 and variation in internal and external force exerted on stage 19. Exposure,position error due to the strain, which is on the submicron order, cannot be ignored in view of exposure position accuracy. However, since the error is small compared with the size of the stage, the strain is approximated with the following model: Equal pitch areas of stage 19 including wafer holders 20A to 20E which areas correspond to wafer holders 20A to 20E are designated as 19A to 19E, respectively, and it is assumed that the areas are rigid and are non-rigidly connected. That is, it is assumed that the strain of stage 19 is a combination of attitude changes of rigid areas 19A to 19E.

Figure 6A:
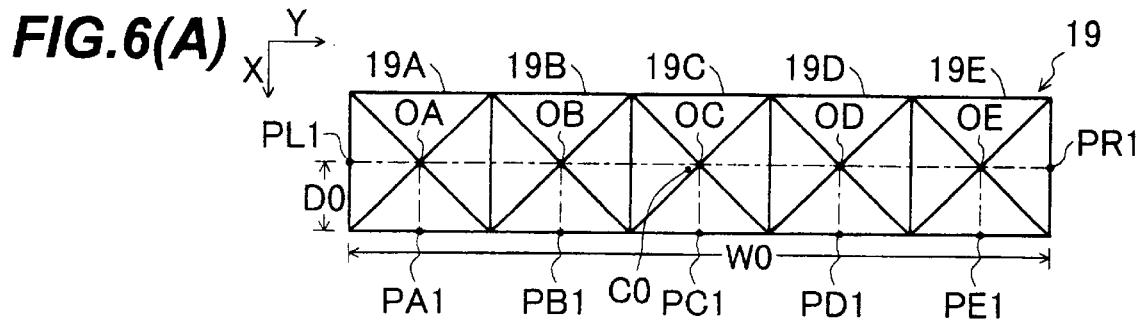
FIGS. 6(A) to 6(E) are stage strain mode explanatory views, FIG. 6(A) being a plane view showing a model before the stage deforms, FIG. 6(B) being a front view showing an X-pitching mode, FIG. 6(C) being a perspective view showing a Y-pitching mode, FIG. 6(D) being a plan view showing a yawing mode, FIG. 6(E) being a perspective view of assistance in explaining the angle of rotation of the stage about each axis in an XA-YA-ZA rectangular coordinate system.

FIG. 6(A) schematically shows the model. The points of intersection of the line passing through points PL1 and PR1 and the lines perpendicular thereto and passing through points PA1 to PE1 are designated as OA to OE.

Figure 6B:
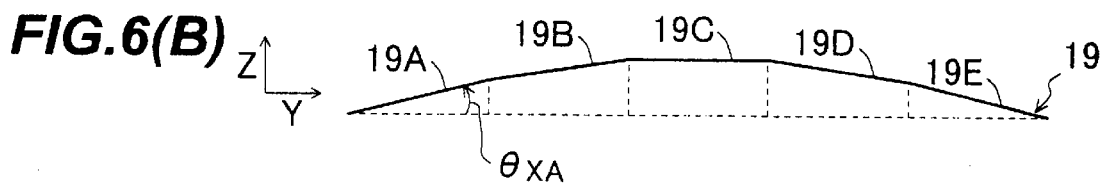
Figure 6C:
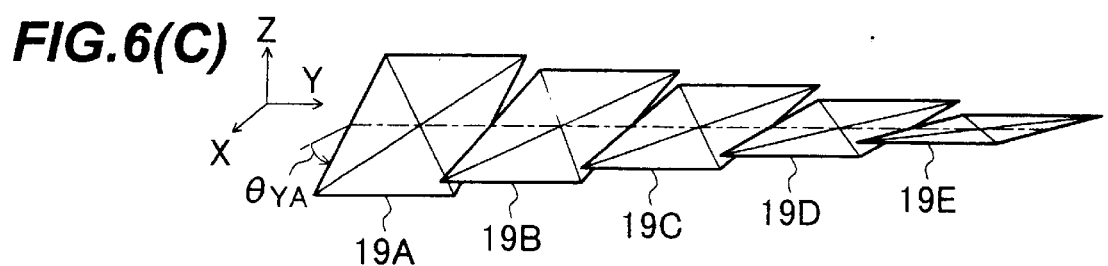
Figure 6D:
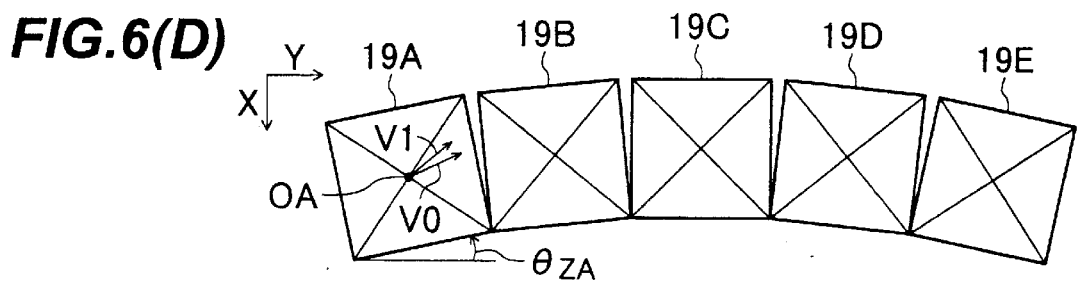

Stage rotational strain modes of this model include ones as shown in FIGS. 6(B) to 6(D). The mode of FIG. 6(B) is, for each of areas 19A to 19E, a rotation about an axis parallel to X axis and is so-called X-pitching. The mode of FIG. 6(C) is, for each of areas 19A to 19E, a rotation about an axis parallel to Y axis and is so-called Y-pitching. The mode of FIG. 6(D) is, for each of areas 19A to 19E, a rotation about an axis parallel to the Z axis and is so-called yawing.

Figure 6E:
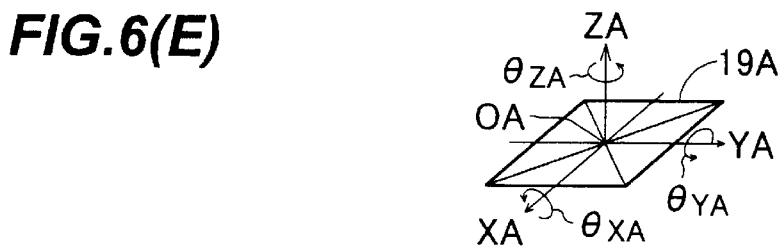

As shown in FIG. 6(E), in an XA-YA-ZA rectangular coordinate system with intersection point OA,of area 19A as the origin, the angles of rotations of area 19A about axes XA, YA and ZA are designated as $\theta_{X_A}$, and $\theta_{Z_A}$.

(1) Abbe Error $\Delta X_{PA}$ Due to X-pitching Angle $\theta_{X_A}$

Figure 5:
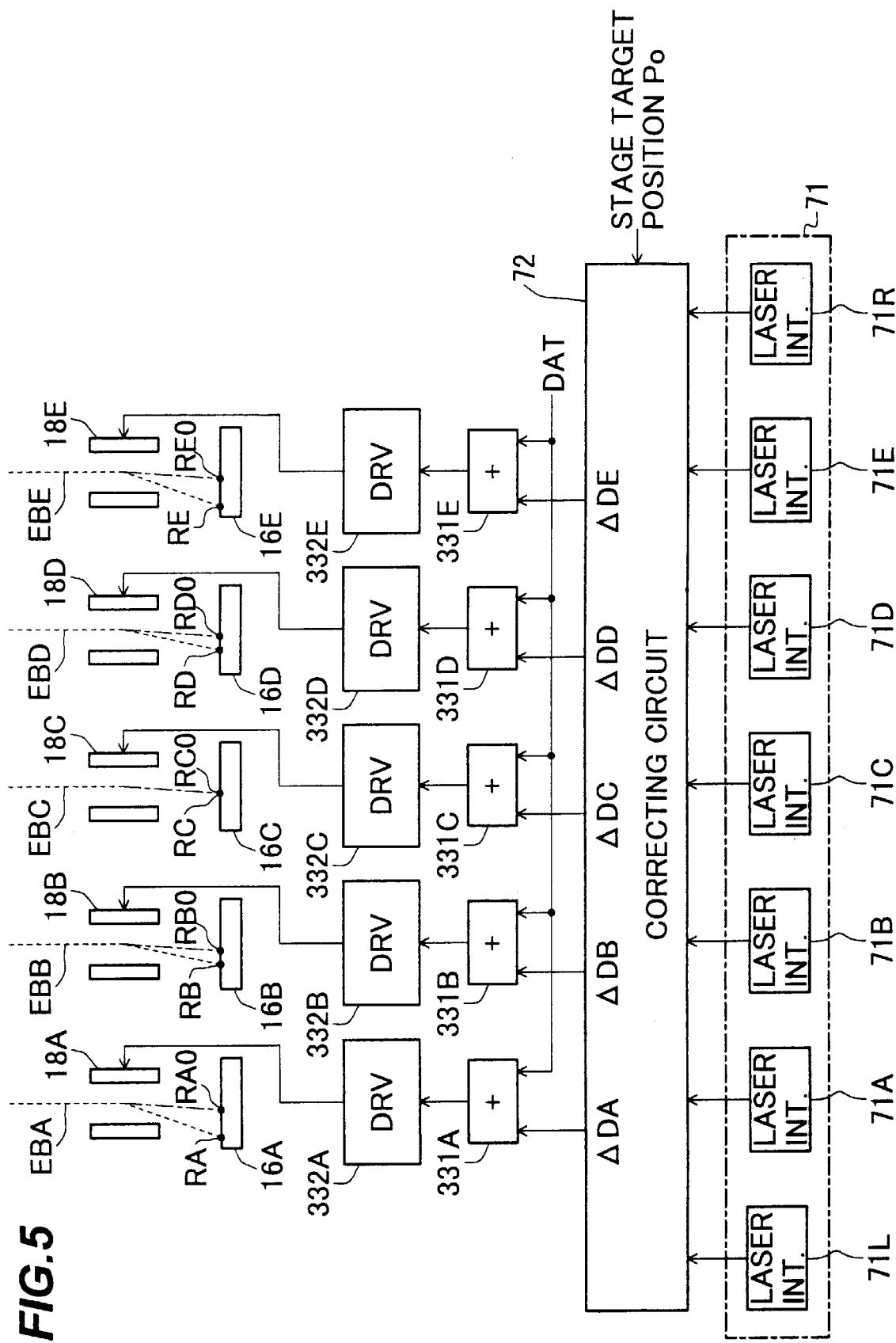
FIG. 5 is a block diagram of an exposure position correcting portion.

X-pitching angle $\theta_{X_A}$ in FIG. 6(B) is calculated by correcting circuit 72 of FIG. 5 with a measurement value of laser interferometric coordinate measuring equipment 71L of FIG. 4(A). In the measurement, as shown in FIGS. 4(A) and 4(B), two laser beams are substantially perpendicularly irradiated from laser interferometric coordinate measuring equipment 71L onto reflecting mirror 70L. The points of irradiation designated as PL1 and PL2 are situated on a straight line parallel to the Z-axis. X-pitching angle $\theta_{X_A}$ is calculated as $\theta_{X_A}$=(difference between the measured positions of points PL2 and PL1)/(distance between points PL1 and PL2).

Figure 9:
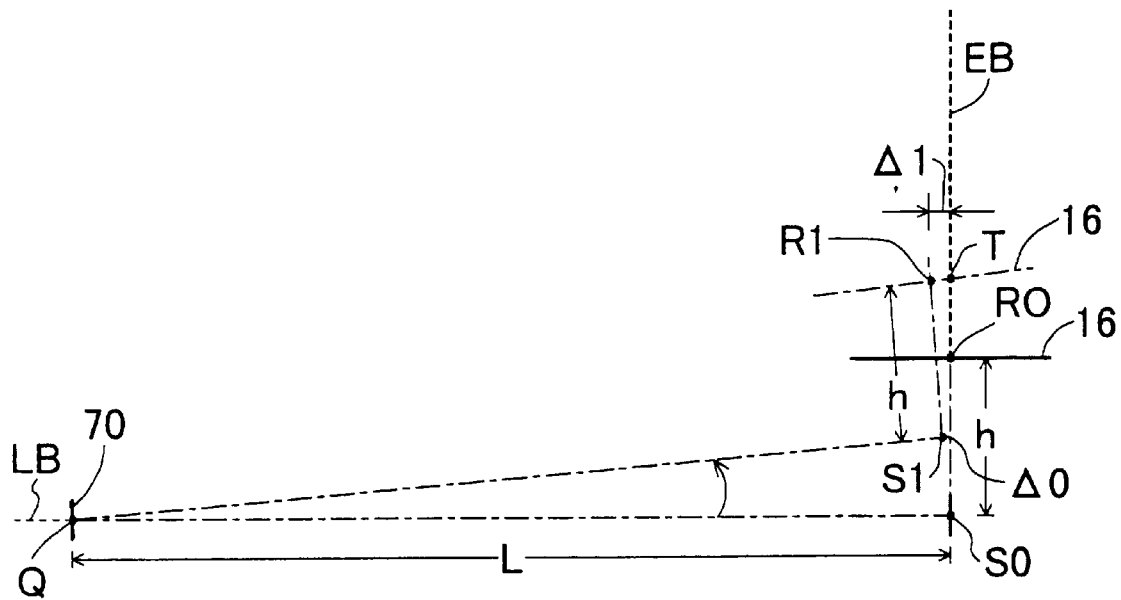
FIG. 9 is a view of assistance in explaining Abbe errors of prior art.

Abbe error $\Delta X_{PA}$ due to X-pitching angle $\theta_{X_A}$ is calculated by $\Delta X_{PA}=h_{X_A}\cdot\theta_{X_A}$, where $h_{X_A}$ is a length corresponding to h in FIG. 9 and does not depend on the position in area 19A.

Laser interferometric coordinate measuring equipment 71R has the same structure as measuring equipment 71L.

Abbe error $\Delta X_{PE}$ due to X-pitching of area 19E is obtained in a similar manner by correcting circuit 72 of FIG. 5 with a measurement value of laser interferometric coordinate measuring equipment 71R. Abbe errors $\Delta X_{PB}$ to $\Delta X_{PE}$ due to X-pitching of areas 19B to 19E, which cannot be obtained in the above-described manner, are obtained by correcting circuit 72 with substituting measurement values $\Delta X_{PA}$ and $\Delta X_{PE}$ into functions $\Delta X_{PB}=FB(\Delta X_{PA}, \Delta X_{PE})$, $\Delta X_{PC}=FC(\Delta X_{PA}, \Delta X_{PE})$ and $\Delta X_{PD}=FD(\Delta X_{PA}, \Delta X_{PE})$ predetermined theoretically or experimentally.

In this case, these functions are expressed with parameters, and the value of the parameters are optimized in the following manner: A set of Errors $\Delta X_{PA}$, $\Delta X_{PE}$ and the exposure position on wafer 16B are measured a multiplicity of times. Error of the exposure position for the target position is obtained as measured error, and the parameters are decided so that the deviation of Abbe error $\Delta X_{PB}$ obtained by substituting measured errors $\Delta X_{PA}$ and $\Delta X_{PE}$ into function $FB(\Delta X_{PA}, \Delta X_{PE})$ from the measured error becomes the smallest. To obtain the exposure position, secondary electrons are detected with scanning charged particle beam EBB so as to cross the above-described marks formed on wafer 16B, and the exposure position is obtained from variation in the amounts of secondary electrons. The parameters of other functions are optimized in a similar manner.

Abbe errors $\Delta X_{PA}$ to $\Delta X_{PE}$ thus obtained are errors in the direction of Y axis on the wafer.

(2) Abbe Error $\Delta Y_{PA}$ Due to Y-pitching Angle $\theta_{YA}$

Next, Y-pitching angle $\theta_{YA}$ in FIG. 6(C) is calculated by correcting circuit 72 of FIG. 5 with a measurement value of laser interferometric coordinate measuring equipment 71A of FIG. 4. In the measurement, three laser beams are substantially perpendicularly irradiated from laser interferometric coordinate measuring equipment 71A onto reflecting mirror 70A. Their points of irradiation are designated as PA1, PA2 and PA3. Points PA1 and PA2 are situated on a straight line parallel to the Z axis and points PA1 and PA3 are situated on a straight line parallel to X axis. Laser interferometric coordinate measuring equipment 71B to 71E have the same structure as measuring equipment 71A.

Y-pitching angle $\theta_{YA}$ is calculated as $\theta_{YA}$=(difference between the measured positions of points PA2 and PA1)/(distance between points PA1 and PA2).

Abbe error $\Delta Y_{PA}$ due to Y-pitching angle $\theta_{YA}$ is calculated with $\Delta Y_{PA} = h_{YA} \cdot \theta_{YA}$, where $h_{YA}$ is a length corresponding to h in FIG. 9 and does not depend on the position in area 19A.

Abbe errors $\Delta Y_{PB}$ to $\Delta Y_{PE}$ due to Y-pitching of areas 19B to 19E are obtained in a similar manner by correcting circuit 72 of FIG. 5 with measurement values of laser interferometric coordinate measuring equipment 71B to 71E.

Abbe errors $\Delta Y_{PA}$ to $\Delta Y_{PE}$ thus obtained are errors in the direction of X axis on the wafer.

(3) Abbe Error $\Delta_{PA}$ Due to Yawing Angle $\theta_{ZA}$

Next, yawing angle $\theta_{ZA}$ in FIG. 6(D) is calculated by correcting circuit 72 of FIG. 5 with a measurement value of laser interferometric coordinate measuring equipment 71A of FIG. 4 as $\theta_{ZA}$=(difference between the measured positions of points PA3 and PA1)/(distance between points PA1 and PA3).

The exposure system is designed so that when charged particle beams EBA to EBE of FIG. 1 are not deflected by the scanning deflector, the charged particle beams irradiates on intersection points OA to OE in FIG. 6(A) respectively. In actuality, however, the charged particle beams deviate from intersection points OA to OE. This deviation is designated as $(\Delta_{XA}, \Delta_{YA})$.

In FIG. 9, assuming that the plane of the figure is the sample plane and that the charged particle beams are irradiated onto point T perpendicularly to the plane of the figure under the condition having above deviation $(\Delta_{XA}, \Delta_{YA})$, for example (0, h) as in FIG. 9, and yawing angle $\theta_{ZA}$, Abbe error $\Delta Z_{PA}$ which is described by a vector $(-\Delta_{YA} \theta_{ZA}, \Delta_{XA} \theta_{ZA})$ is caused. This error does not depend on L, or the position in area 19A.

Abbe errors $\Delta Z_{PB}$ to $\Delta Z_{PE}$ due to yawing of areas 19B to 19E are obtained in a similar manner by correcting circuit 72 of FIG. 5 with measurement values of laser interferometric coordinate measuring equipment 71B to 71E.

(4) Rotational error $\Delta_{ZA}$ due to yawing angle $\theta_{ZA}$

Figure 7:
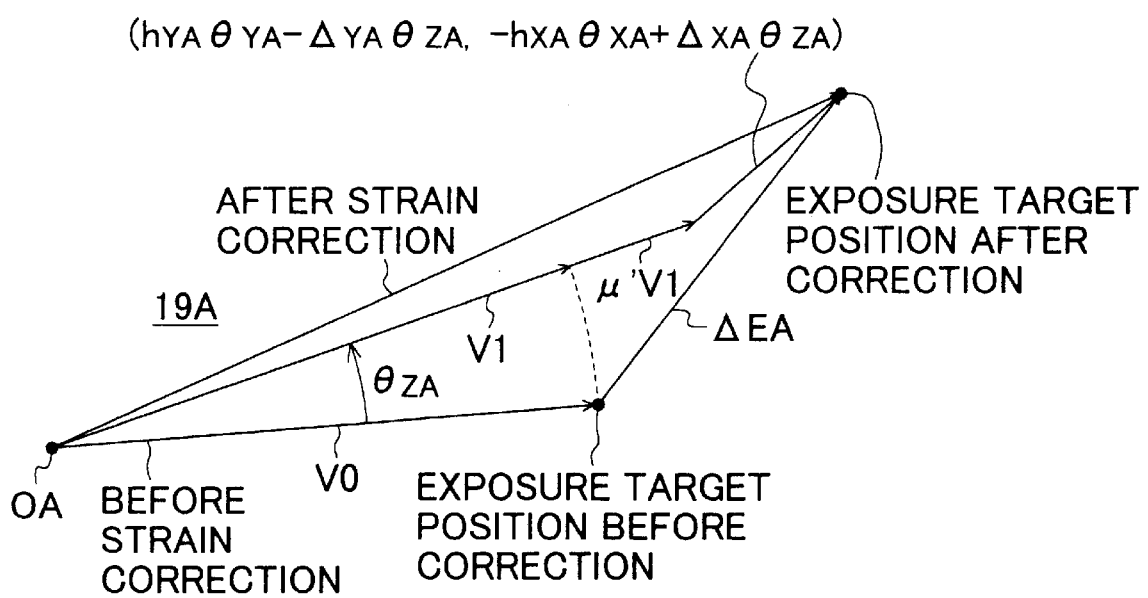
FIG. 7 is a vector view showing strain correction in area 19A of the stage.

In FIG. 7, exposure target position vector V0 before rotating by yawing angle $\theta_{ZA}$ becomes vector V1 by this rotating. Exposure position error vector $\Delta_{ZA}$ due to yawing angle $\theta_{ZA}$ is V0–V1 and depends on the position on area 19A. The maximum value of the magnitude of exposure target position vector V0, or the maximum deflected length by main deflector 17A of FIG. 1, is approximately 1 mm. For example, if $\theta_{ZA}=5/(200\times10^3)$ and $|V1|=1$ mm, then $|V1-V0|=|V0|\theta_{ZA}=0.025$ $\mu$m. Error vector $\Delta_{ZA}$ is obtained by correcting circuit 72.

Exposure position error vectors $\Delta_{ZB}$ to $\Delta_{ZE}$ of areas 19B to 19E due to rotations of yawing angles $\theta_{ZB}$ to $\theta_{ZE}$ are each obtained in a similar manner by correcting circuit 72 with measurement values of laser interferometric coordinate measuring equipment 71B to 71E.

(5) Expansion and Contraction Strain of Stage 19 Due to Temperature Change

Since the response of the temperature detector is as slow as several minutes and the expansion or contraction due to a temperature change of 0.01° C. cannot be ignored as mentioned previously, the amount of expansion or contraction is directly measured. The amount of expansion or contraction of area 19A in Y direction in X-pitching mode of FIG. 6(B) is approximately $\Delta 0$ of FIG. 9, for example, $0.125\times10^{-3}$ $\mu$m as mentioned previously, and the amount of expansion or contraction of stage 19 in Y direction which is about $5\times0.125\times10^{-3}$ $\mu$m can be ignored. Also in regard to the modes of FIGS. 6(C) and 6(D), the amount of expansion or contraction of stage 19 in Y direction can be ignored. Therefore, stage length deviation $\Delta W = W - W0$ can be regarded as the amount of Y-direction expansion or contraction due to a temperature change, where W is a length between points PL1 and PR1 and W0 is a length W at a predetermined temperature T0. Assume that expansion or contraction ratio $\mu = \Delta W / W$ is the same in X and Y directions and uniform on stage 19.

The lengths from point PL1 to intersection points OA to OE at the temperature T0 are designated as LA0, LB0, LC0, LD0 and LE0, respectively. Assume that in FIG. 6(A), the distances from intersection points OA to OE to the reflecting surfaces of reflecting mirrors 70A to 70E at the temperature T0 are equal to one another and designated as D0. The Y coordinate measurement value of point PL1 and X coordinate measurement values of points PA1 to PE1 in X-Y coordinate system are designated as YL1 and XA1 to XE1, respectively, where points PB1 to PE1 represent laser beam irradiation points on reflecting mirrors 70B to 70E corresponding to point PA1. When stage 19 is situated at the origin as shown in FIG. 6(A), YL1 and XA1, to XE1 are designated as YL0 and XA0 to XE0, respectively. Viewed from a fixed coordinate system outside stage 19, intersection points OA to OE are fixed, but viewed from stage 19, they move as stage 19 moves. Namely, if stage 19 moves by (x1, y1) at temperature T0, then each coordinate of intersection points OA to OE in coordinate systems fixed to samples becomes the same (−x1, −y1). If points PL1 and PA1 to PE1 is unchanged and temperature changes from T0, the coordinates of intersection points OA to OE change from the same (0, 0) to ($\mu$·D0, −$\mu$·LA0), ($\mu$·D0, −$\mu$·LB0), ($\mu$·D0, −$\mu$·LC0), ($\mu$·D0, −$\mu$·LD0) and ($\mu$·D0, −$\mu$·LE0), respectively. Therefor, the present position coordinates of intersection points OA to OE in coordinate systems fixed to samples, respectively, are expressed as described below.

OA: (XA0−XA1+$\mu$·D0, YL0−YL1−$\mu$·LA0)
OB: (XB0−XB1+$\mu$·D0, YL0−YL1−$\mu$·LB0)
OC: (XC0−XC1+$\mu$·D0, YL0−YL1−$\mu$·LC0)
OD: (XD0−XD1+$\mu$·D0, YL0−YL1−$\mu$·LD0)
OE: (XE0−XE1+$\mu$·D0, YL0−YL1−$\mu$·LE0)

These coordinates are calculated by correcting circuit 72 of FIG. 5.

Assume that expansion/contraction ratio $\mu'$ of the sample is proportional to stage expansion/contraction ratio $\mu$. With regard to area 19A, vector VO of FIG. 7 becomes $(1+\mu')V1$ through temperature correction and further becomes vector $(1+\mu')V1+(h_{YA}\cdot\theta_{YA}-\Delta_{YA}\cdot\theta_{ZA}, -h_{XA}\cdot\theta_{XA}+\Delta_{XA}\ \theta_{ZA})$ when the Abbe errors due to X-pitching, Y-pitching and yawing are corrected. That is, stage strain correction vector $\Delta EA$ for exposure target position vector V0 becomes $\Delta EA=(1+\mu')V1-V0+(h_{YA}\cdot\theta_{YA}-\Delta_{YA}\cdot\theta_{ZA}, -h_{XA}\cdot\theta_{XA}+\Delta_{XA}\cdot\theta_{ZA})$. The stage strain correction vectors for areas 19B to 19E are obtained in a similar manner. These stage strain correction vectors corresponding to $\Delta EA$ are designated as $\Delta EB$ to $\Delta EE$.

FIG. 5 is a block diagram of an exposure position correcting portion.

Laser interferometric coordinate measuring equipment 71A to 71E, 71L and 71R will be referred to as laser interferometric coordinate measuring equipment 71. Correcting circuit 72 receives the output of equipment 71 and stage target position Po from system controller 32 of FIG. 1. Stage target position Po is, for example, a target position of intersection point OA on the sample. Correcting circuit 72 calculates the present position coordinates of intersection points OA to OE as above-described, and calculates vectors $\Delta PA$ to $\Delta PE$, which are the differences between the present position coordinates of intersection points OA to OE and the target positions thereof, as sample position correction vectors. Correcting circuit 72 further calculates stage strain correction vectors $\Delta EA$ to $\Delta EE$, adds sample position correction vectors $\Delta PA$ to $\Delta PE$ thereto to obtain correction vectors $\Delta EA+\Delta PA$ to $\Delta EE+\Delta PE$ and provides vectors proportional thereto to one input terminals of adders 331A to 331E as deflection correction vectors $\Delta DA$ to $\Delta DE$.

To the other input terminals of adders 331A to 331E, sub-deflection vector DAT is provided from system controller 32 of FIG. 1. The outputs of adders 331A to 331E are provided through drivers 332A to 332E to sub-deflectors 18A to 18E. Adder 331A and driver 332A are included in beam controller 33A of FIG. 1. Adder 331B and driver 332B are included in beam controller 33B of FIG. 1. This applies to adders 331C to 331E and drivers 332C to 332E.

Since deflection correction vectors $\Delta DA$ to $\Delta DE$ are comparatively easily calculated, the deflection correction is made, for example, every one shot cycle of exposure, for example, at 10 MHz.

When deflection correction vectors $\Delta DA$ to $\Delta DE$ are all 0, charged particle beams EBA to EBE are irradiated to points RA0 to RE0 on wafers 16A to 16E with deflecting by sub-deflectors 18A to 18E, respectively. Deflection of charged particle beams EBA to EBE is corrected by deflection correction vectors $\Delta DA$ to $\Delta DE$ and the deflection-corrected beams are irradiated onto points RA to RE on wafers 16A to 16E.

In actuality, since there are errors in the installation positions of sub-deflectors 18A to 1BE and their sensitivity which is the ratio of the deflection amount to the applied voltage slightly differ among sub-deflectors 18A to 18E, the values of deflection correction vectors $\Delta DA$ to $\Delta DE$ are obtained in consideration of these.

When stage 19 is used which is elongated in the line direction of columns and common to a plurality of charged particle beam exposure apparatus, the strain of stage 19 which cannot be ignored varies according to variation in temperature of stage 19 and variation in internal and external force applied to stage 19. However, according to this embodiment, the variation in strain is corrected in real time, so that the exposure position accuracy improves. This enables exposure of finer patterns.

Although preferred embodiment of the present invention has been described, it is to be understood that the invention is not limited thereto and that various changes and modifications may be made without departing from the spirit and scope of the invention.

For example, balancing stage 21 may be disposed at a side of scanning stage 19, for example, below arm robots 40A to 40E of FIG. 2. Moreover, as balancing stage 21, one may be used that is the same as scanning stage 19.

While in this embodiment, it is assumed that ratio $\mu$ of expansion/contraction due to temperature variation is uniform on stage 19 for simplicity, the ratio $\mu$ may be non-uniform on stage 19 in consideration of restraint by the guide mechanism of stage 19.

What is claimed is:

1. A charged particle beam exposure system including a plurality of charged particle beam exposure apparatus placed in line to parallelly expose a plurality of samples with scanning a plurality of charged particle beams and said plurality of samples, said charged particle beam exposure system comprising:
    a single scanning stage where said plurality of samples is mounted;
    a balancing stage; and
    a stage controller for controlling scanning of said balancing stage in such a way that a barycenter of said scanning stage and said balancing stage becomes a fixed point.

2. A charged particle beam exposure system according to claim 1, wherein said balancing stage is disposed below said scanning stage.

3. A charged particle beam exposure method using a plurality of charged particle beam exposure apparatus placed in line to parallelly expose a plurality of samples with scanning a plurality of charged particle beams by deflectors and with scanning said plurality of samples, said method comprising the steps of:
    providing a single scanning stage where said plurality of samples is mounted;
    measuring a position of each lengthwise end portion of said scanning stage as measured end positions;
    calculating positions of said plurality of samples mounted on said scanning stage based on said measured end positions;
    calculating deviation of the calculated positions of said plurality of samples from target positions thereof as sample position errors; and
    correcting said sample position errors by said deflectors.

4. A charged particle beam exposure method according to claim 3, wherein said calculating position step includes calculating an expansion/contraction ratio of said scanning stage based on said measured end positions and a reference length of said scanning stage to obtain said positions of said plurality of samples mounted on said scanning stage.

5. A charged particle beam exposure method according to claim 3, comprising the additional steps of:
    modeling said scanning stage as that a plurality of rigid areas is coupled loosely, each of said rigid areas having one of said samples mounted;
    measuring at least two positions on a side portion for each of said rigid areas as measured side positions to obtain rotational angle;
    calculating deviation of an exposure target position due to a rotation of each of said rigid areas as a rotational exposure position error based on said measured side positions; and correcting each said rotational exposure position error by each of said deflectors.

6. A charged particle beam exposure method according to claim 5, wherein said rotation includes a first, rotation about a first axis in a lengthwise direction of said scanning stage, and wherein said rotational exposure position error includes a Y-pitching Abbe error proportional to a rotational angle $\theta_Y$ of said first rotation.

7. A charged particle beam exposure method according to claim 5, wherein said rotation includes a second rotation about a second axis perpendicular to a sample plane;

wherein said rotational exposure position error includes a difference between a vector of said exposure target position whose starting point is a substantial intersection point of an optical axis and said sample plane and a vector which is derived from rotating said vector of said exposure target position by a rotational angle $\theta_Z$ of said second rotation.

8. A charged particle beam exposure method according to claim 5, wherein said rotation includes a second rotation about a second axis perpendicular to a sample plane;

wherein said rotational exposure position error includes a yawing Abbe error proportional to a rotational angle $\theta_Z$ of said second rotation.

9. A charged particle beam exposure method according to claim 5, wherein said rotation includes a third rotation about a third axis perpendicular to both of said first axis and said second axis; and wherein said rotational exposure position error includes a X-pitching Abbe error proportional to a rotational angle $\theta_X$ of said third rotation.

10. A charged particle beam exposure method according to claim 3, modeling said scanning stage as that a plurality of rigid areas is coupled loosely, each of said rigid areas having one of said samples mounted, a number of said rigid areas being 3 or more;

measuring at least two positions of each lengthwise end portion of said scanning stage as measured end positions to obtain each rotational angle $\theta_X$ about an axis perpendicular to both a lengthwise direction of said scanning stage and a normal direction to a sample plane, said each rotational angle $\theta_X$ being of end parts of said rigid areas;

calculating deviations of exposure target positions due to each said rotational angle $\theta_X$ as a first X-pitching Abbe error proportional to said rotational angle $\theta_X$ based on said measured end positions;

obtaining second X-pitching Abbe error(s) of said rigid areas excepting said end parts of said, rigid areas as values of function(s) of said first X-pitching Abbe errors for end parts of said rigid areas; and correcting said first and second X-pitching Abbe errors by said deflectors.

11. A charged particle beam exposure method according to claim 10, wherein said obtaining step includes:

expressing said function(s) each having a parameter;

measuring a set of said first Abbe errors for said end parts of said rigid areas and an actual exposure position on any of said rigid areas excepting said end parts of said rigid areas a plurality of times;

deriving actual exposure position errors from said actual exposure positions and an exposure target position thereof; and deciding said parameter in such a way that deviation of Abbe errors, each of which is obtained by substituting said first Abbe errors for said end parts of said rigid areas into said function, from said actual exposure position errors become minimum as a whole.

12. A charged particle beam exposure method according to claim 5, wherein said rotation includes a first rotation about a first axis in a lengthwise direction of said scanning stage, a second rotation about a second axis perpendicular to a sample plane and a third rotation about a third axis perpendicular to both of said first axis and said second axis, and wherein said rotational exposure position error includes a Y-pitching Abbe error proportional to a rotational angle $\theta_Y$ of said first rotation, a yawing Abbe error proportional to a rotational angle $\theta_Z$ of said second rotation, and a X-pitching Abbe error proportional to a rotational angle $\theta_X$ of said third rotation.

13. A charged particle beam exposure system including a plurality of charged particle beam exposure apparatus placed in line to parallelly expose a plurality of samples with scanning a plurality of charged particle beams by deflectors and said with scanning samples, said system comprising:

a single scanning stage where said plurality of samples is mounted;

first and second reflecting means secured respectively to first and second lengthwise end portions of said scanning stage in such a way that back surfaces thereof are opposed to each other;

first and second laser interferometric coordinate measuring equipment disposed on fixed sides apart from said scanning stage so that laser beams therefrom are perpendicularly irradiated to mirror surfaces of said first and second reflecting means, respectively to obtain measured end positions; and a correcting circuit for calculating positions of said plurality of samples mounted on said scanning stage based on said measured end positions, calculating deviation of the calculated positions of said plurality of samples from target positions thereof as sample position errors and outputting a correction value to correct said sample position errors as a component by said deflectors.

14. A charged particle beam exposure system according to claim 13, wherein said correcting circuit calculates an expansion/contraction ratio of said scanning stage based on said measured end positions and a reference length of said scanning stage to obtain said positions of said plurality of samples mounted on said scanning stage.

15. A charged particle beam exposure system according to claim 14, further comprising:

third reflecting means secured to said scanning stage corresponding to respective said samples mounted on said scanning stage in such a way that reflecting surfaces thereof are perpendicular to those of said first and second reflecting means; and third laser interferometric coordinate measuring equipment disposed on fixed sides apart from said scanning stage so that laser beams therefrom are perpendicularly irradiated to respective said mirror surfaces of said third reflecting means to measure at least two positions on said third reflecting means as measured side positions for each of said samples mounted on said scanning stage; and wherein said correcting circuit calculates rotational angles of respective said third reflecting means based on said measured side positions, calculates deviation of an exposure target position due to a rotation of each of rigid areas as a rotational exposure position error based on said measured side positions, and outputs said correction value to correct said rotational exposure position error as a component by said deflectors, where said rigid areas are of a model of said scanning stage, said model is such that a plurality of said rigid areas is coupled loosely, each of said rigid areas having one of said samples mounted.

16. A charged particle beam exposure system according to claim 15, wherein at said correcting circuit, said rotation includes a first rotation about a first axis in a lengthwise direction of said scanning stage, a second rotation about a second axis perpendicular to a sample plane and a third rotation about a third axis perpendicular to both of said first axis and said second axis, and said rotational exposure position error includes a Y-pitching Abbe error proportional to a rotational angle $\theta_Y$ of said first rotation, a yawing Abbe error proportional to a rotational angle $\theta_Z$ of said second rotation, and a X-pitching Abbe error proportional to a rotational angle $\theta_X$ of said third rotation.

17. A charged particle beam exposure system according to claim 16, wherein a number of said rigid areas being 3 or more, wherein said first and second laser interferometric coordinate measuring equipment measure at least two positions on each of said mirror surfaces of said first and second reflecting means to obtain said rotational angle $\theta_X$ of said third rotation with regard to each of said end parts of said rigid areas, and wherein said correcting circuit calculates a first X-pitching Abbe error proportional to said rotational angle $\theta_X$ with regard to each of said end parts of said rigid areas, obtains second X-pitching Abbe error(s) of said rigid areas excepting said end parts of said rigid areas as value(s) of function(s) of said first X-pitching Abbe error for each of said end parts of said rigid areas and corrects said first and second X-pitching Abbe errors by said deflectors.

* * * * *